United States Patent
Goldberger et al.

(10) Patent No.: US 10,224,363 B2
(45) Date of Patent: Mar. 5, 2019

(54) TERAHERTZ CMOS SENSOR

(71) Applicant: NETEERA TECHNOLOGIES LTD., Jerusalem (IL)

(72) Inventors: Haim Goldberger, Modiin (IL); Péter Földesy, Dunakeszi (HU); Omer Eshet, Kibbutz Einat (IL)

(73) Assignee: NETEERA TECHNOLOGIES LTD., Jerusalem (IL)

( * ) Notice: Subject to any disclaimer, the term of this patent is extended or adjusted under 35 U.S.C. 154(b) by 27 days.

(21) Appl. No.: 15/636,667

(22) Filed: Jun. 29, 2017

(65) Prior Publication Data
US 2018/0033819 A1     Feb. 1, 2018

Related U.S. Application Data

(60) Provisional application No. 62/367,654, filed on Jul. 28, 2016.

(51) Int. Cl.
*H01L 27/14* (2006.01)
*H01L 27/146* (2006.01)
(Continued)

(52) U.S. Cl.
CPC ...... *H01L 27/14649* (2013.01); *G01J 5/0837* (2013.01); *H01L 27/14623* (2013.01); *H01L 27/14636* (2013.01); *H01L 27/14689* (2013.01); *H01Q 1/2283* (2013.01); *H01Q 1/526* (2013.01); *H01Q 9/28* (2013.01); *H01Q 15/08* (2013.01); *H01Q 19/062* (2013.01); *H01Q 19/108* (2013.01); *H01Q 21/062* (2013.01); *H01Q 25/001* (2013.01); *H04N 5/378* (2013.01);
(Continued)

(58) Field of Classification Search
CPC ................................ H01L 27/14; H04N 5/378
See application file for complete search history.

(56) References Cited

U.S. PATENT DOCUMENTS 7,583,074 B1 *   9/2009   Lynch ..................... G01S 13/89
                                                        324/120
7,919,755 B2     4/2011   Rahman
(Continued)

FOREIGN PATENT DOCUMENTS

WO        2014/135749       9/2014

OTHER PUBLICATIONS

Peter Foldesy et al: 11 Integrated CMOS sub-THz imager array, Cellular Nanoscale Networks and Their Applications (CNNA), 2012 13th International Workshop on, IEEE, Aug. 29, 2012 (Aug. 29, 2012), pp. 1-4.

(Continued)

*Primary Examiner* — Yara B Green
(74) *Attorney, Agent, or Firm* — Soroker Agmon Nordman

(57) ABSTRACT

An imaging sensor for accepting terahertz signals, including a die made of a dielectric material, one or more antennas for receiving terahertz signals, positioned on top of the die or in an upper layer of the die, each antenna having a CMOS detector electrically coupled to the antenna and positioned in the die below the antenna, a metal shield layer in the die below the antennas and above the CMOS detectors, shielding the CMOS detector from interference signals, a shielding layer under the die comprising a back metal coating and/or a layer of silver epoxy glue for attaching the bottom of the die to a lead frame.

20 Claims, 9 Drawing Sheets

(51) Int. Cl.

| | | |
|---|---|---|
| *H04N 5/378* | (2011.01) | |
| *G01J 5/08* | (2006.01) | |
| *H01Q 1/22* | (2006.01) | |
| *H01Q 1/52* | (2006.01) | |
| *H01Q 9/28* | (2006.01) | |
| *H01Q 15/08* | (2006.01) | |
| *H01Q 19/06* | (2006.01) | |
| *H01Q 19/10* | (2006.01) | |
| *H01Q 21/06* | (2006.01) | |
| *H01Q 25/00* | (2006.01) | |
| *G01J 5/20* | (2006.01) | |

(52) U.S. Cl.
CPC .......... *G01J 2005/202* (2013.01); *H01L 2224/32145* (2013.01); *H01L 2224/32245* (2013.01); *H01L 2224/48247* (2013.01); *H01L 2224/48465* (2013.01); *H01L 2224/73265* (2013.01); *H01L 2924/181* (2013.01)

(56) References Cited

U.S. PATENT DOCUMENTS

| | | |
|---|---|---|
| 7,947,955 B2 | 5/2011 | Kawano et al. |
| 8,148,688 B2 | 4/2012 | Kawano et al. |
| 8,253,104 B2 | 8/2012 | Kawano et al. |
| 8,274,058 B1 | 9/2012 | Wanke et al. |
| 8,354,642 B2 | 1/2013 | Berger et al. |
| 8,658,976 B2 | 2/2014 | Sengupta et al. |
| 8,872,112 B2 | 10/2014 | Corcos et al. |
| 2005/0002149 A1 | 1/2005 | Nakatani et al. |
| 2005/0082681 A1* | 4/2005 | Wijdenes ............ H01L 23/3135 257/778 |
| 2008/0100504 A1* | 5/2008 | Martin .................. H01Q 3/22 342/179 |
| 2008/0158091 A1 | 7/2008 | Imaoka et al. |
| 2010/0133349 A1 | 6/2010 | Shingai |
| 2011/0001173 A1 | 1/2011 | Ojefors et al. |
| 2012/0153148 A1 | 6/2012 | Federici et al. |
| 2014/0002666 A1* | 1/2014 | Eden .................... G01J 5/0803 348/164 |
| 2014/0091376 A1* | 4/2014 | Boppel ................ H01L 31/101 257/291 |
| 2014/0151768 A1 | 6/2014 | Pfeiffer et al. |
| 2015/0340765 A1 | 11/2015 | Dang et al. |
| 2015/0364508 A1 | 12/2015 | Bars et al. |
| 2016/0091776 A1* | 3/2016 | Mohammed ........... G02F 1/353 250/341.1 |

OTHER PUBLICATIONS

Alvydas Li Sauskas et al: "Terahertz detection and coherent imaging from 0.2 to 4.3 THz with silicon CMOS field-effect transistors", Microwave Symposium Digest (MTT), 2012 IEEE MTT-S International, IEEE, Jun. 17, 2012 (Jun. 17, 2012),pp. 1-3.

* cited by examiner

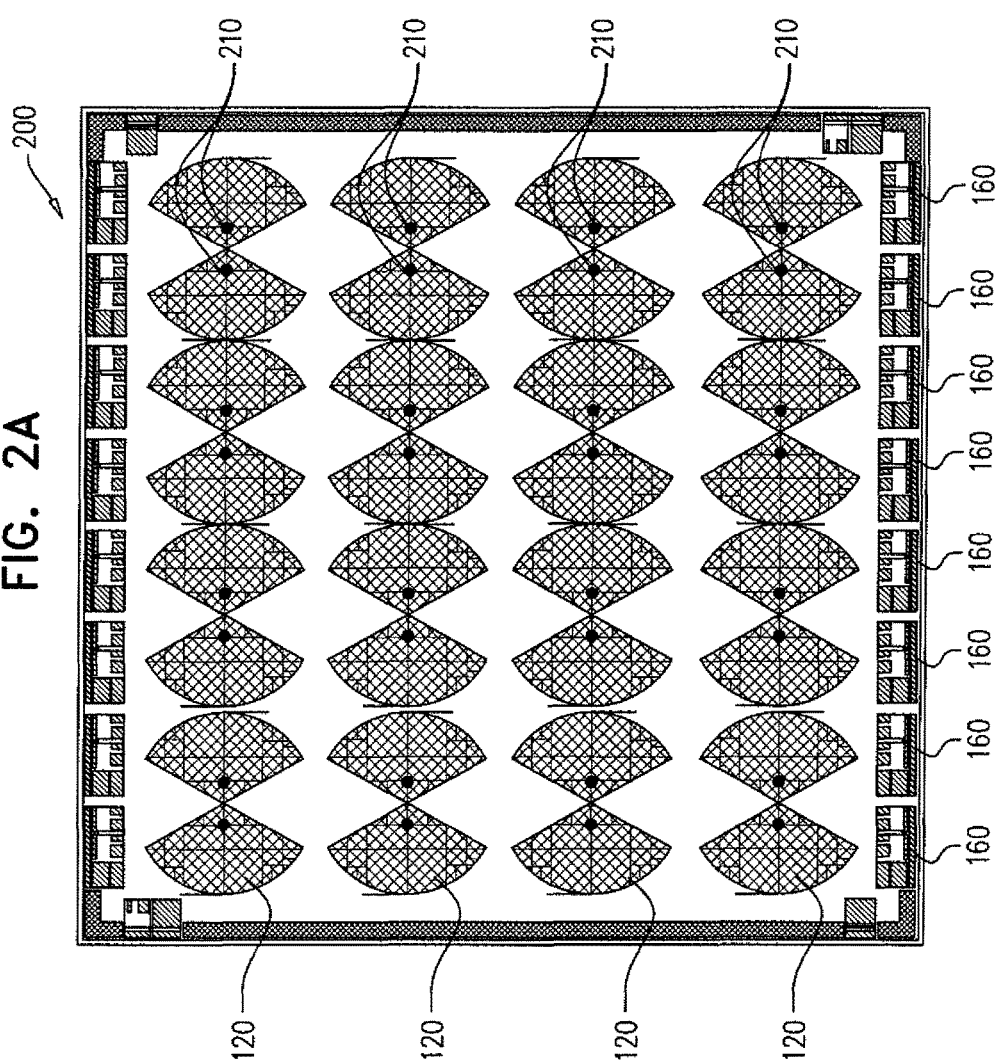

TERAHERTZ CMOS SENSOR

RELATED APPLICATIONS

This application claims priority under 35 U.S.C. 120 from U.S. provisional application No. 62/367,654 filed on Jul. 28, 2016, the disclosure of which is incorporated herein by reference.

TECHNICAL FIELD

The present invention relates to a sensor for acquiring images of electromagnetic signals in the terahertz range and more specifically wherein the sensor is implemented by CMOS technology.

BACKGROUND

Terahertz signals refer to signals in the terahertz range and the sub-terahertz range (e.g. signals having a frequency of about 100 GHz to 3 THz) lies between the infrared range and the microwave range. Until recently the terahertz range (including the sub-terahertz range) was widely ignored. Since there were few sources, applications and detectors for handling such signals. In recent years the terahertz range has begun to be explored, however the devices used for detecting terahertz electromagnetic signals generally use complex and expensive equipment, in contrast to simple, low cost CMOS integrated circuits used for other ranges. Additionally, some devices need to be cooled to function properly in contrast to CMOS integrated circuits, which can function at room temperature.

One of the problems with terahertz waves is that they penetrate many of the commonly used materials (e.g. materials used in CMOS technology), optionally, interfering with any accepted signals. Additionally, the strength of a signal accepted by a terahertz antenna is not much greater than the internal noise of a standard CMOS transistor.

Accordingly, it is desirable to design a terahertz sensor that can be implemented with standard CMOS technology and that provides a good quality output signal.

SUMMARY

An aspect of an embodiment of the disclosure relates to a system and method for forming an imaging sensor for accepting terahertz signals (including sub-terahertz signals). The system includes a die structure formed by a chip manufacturing process with one or more antennas on top of the die or in an upper layer of the die. Optionally, the antennas may be in an array/matrix form, for example 4 rows by 4 columns of antennas or 3 rows by 2 columns of antennas. Each antenna is electrically connected to a CMOS detector that is positioned in the die below the antennas. Additionally, a metallic shielding layer is formed in the die above the CMOS detector and below the antennas. A metal coating layer is formed under the die and/or a layer of silver epoxy glue is used under the die to attach a lead frame under the die. Optionally, the shielding layer and the coating layer protect the CMOS detector from interference that can affect the performance of the CMOS detector.

There is thus provided according to an exemplary embodiment of the disclosure, an imaging sensor for accepting terahertz signals, comprising:
a die made of a dielectric material;
one or more antennas for receiving terahertz signals, positioned on top of the die or in an upper layer of the die;
each antenna having a CMOS detector electrically coupled to the antenna and positioned in the die below the antenna;
a metal shield layer in the die below the antennas and above the CMOS detectors, shielding the CMOS detector from interference signals;
a shielding layer under the die comprising a metal coating and/or a layer of silver epoxy glue for attaching the bottom of the die to a lead frame.

In an exemplary embodiment of the disclosure, multiple antennas are positioned to form an array. Optionally, all of the antennas are identical. Alternatively, some of the antennas have different orientations. Further alternatively, some of the antennas are distinct. Optionally, each antenna comprises two wings, one connected to the CMOS detector gate and one connected to the CMOS detector source. In an exemplary embodiment of the disclosure, each antenna is electrically coupled to the CMOS detector by a pair of via connectors. Optionally, the via connectors are located in a hole in the die with a clearance between the via connector and the metal layers in the die. In an exemplary embodiment of the disclosure, the via connectors comprise a stack of metal layers supported by conducting beams between the metal layers. Optionally, the metal shield layer is porous and the pores are filled with the dielectric material of the die. In an exemplary embodiment of the disclosure, the imaging sensor includes a low noise amplifier in the same integrated circuit package as the die. Optionally, the low noise amplifier is positioned under the die. In an exemplary embodiment of the disclosure, the low noise amplifier is positioned upside down under the die. Optionally, the imaging sensor is packaged with a lens shaped top to focus the terahertz signals received by the antennas.

There is further provided according to an exemplary embodiment of the disclosure, a method of forming an imaging sensor for accepting terahertz signals, comprising:
positioning one or more antennas for receiving terahertz signals on top of a dielectric die or in an upper layer of the die;
electrically coupling a CMOS detector to each antenna; wherein the CMOS detector is positioned in the die below the antenna;
forming a metal shield layer in the die below the antennas and above the CMOS detectors, for shielding the CMOS detector from interference signals;
coating the bottom of the die with a metal coating and/or using a layer of silver epoxy glue for attaching the bottom of the die to a lead frame.

In an exemplary embodiment of the disclosure, multiple antennas are positioned to form an array. Optionally, all of the antennas are identical. Alternatively, some of the antennas have different orientations. Further alternatively, some of the antennas are distinct. In an exemplary embodiment of the disclosure, each antenna comprises two wings, one connected to the CMOS detector gate and one connected to the CMOS detector source. Optionally, each antenna is electrically coupled to the CMOS detector by a pair of via connectors.

BRIEF DESCRIPTION OF THE DRAWINGS

The present disclosure will be understood and better appreciated from the following detailed description taken in conjunction with the drawings. Identical structures, elements or parts, which appear in more than one figure, are generally labeled with the same or similar number in all the figures in which they appear. It should be noted that the elements or parts in the figures are not necessarily shown to scale such that each element or part may be larger or smaller than actually shown.

FIG. 1A is a schematic illustration of terahertz imaging sensor, according to an exemplary embodiment of the disclosure;

FIG. 2A is a schematic illustration of an array of antennas on a terahertz imaging sensor, according to an exemplary embodiment of the disclosure;

DETAILED DESCRIPTION

Figure 1A:
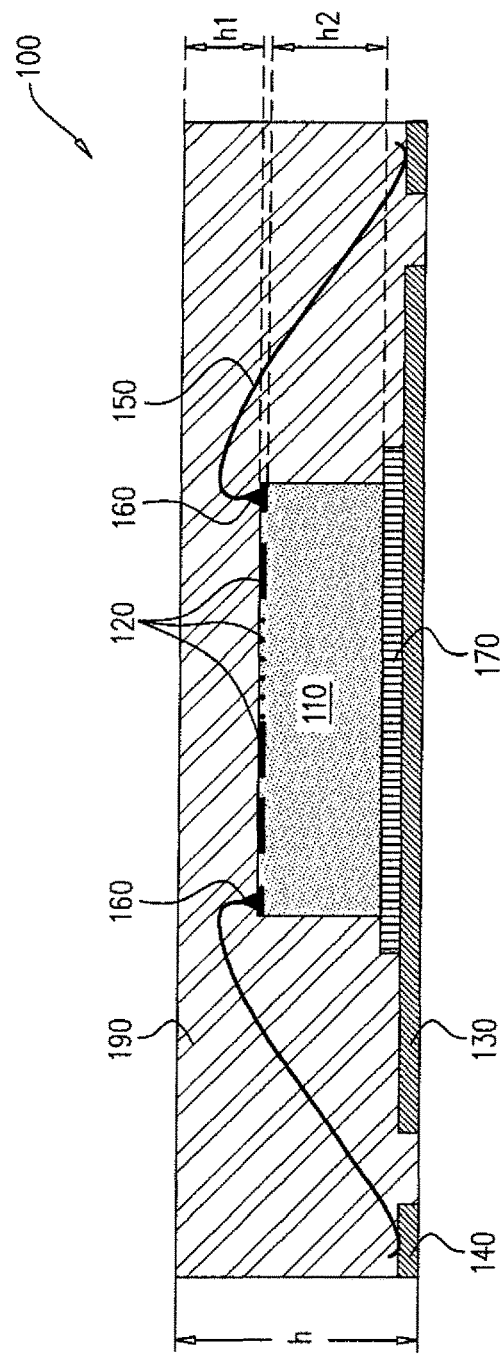
FIG. 1B is a schematic illustration of an alternative terahertz imaging sensor, according to an exemplary embodiment of the disclosure.

FIG. 1A is a schematic illustration of terahertz imaging sensor 100, according to an exemplary embodiment of the disclosure. In an exemplary embodiment of the disclosure, the imaging sensor 100 is formed as a chip using bulk CMOS or SOI (Silicon on isolator) technology. Optionally, the imaging sensor 100 is formed having a die 110 with an array of antennas 120 on the top of the die 110, for example by printing metallic antennas (e.g. copper, gold, aluminum, or other metallic material) on the top surface of the die 110. In an exemplary embodiment of the disclosure, the material of the die 110 serves as a dielectric material and the heights "h", "h1" and "h2" of the dielectric material and curable filling material 190 are selected so that the dimensions of the antennas 120 correspond to the wavelengths of a specific range of terahertz signals being measured to provide optimal gain for those wavelengths.

In an exemplary embodiment of the disclosure, the imaging sensor 100 is formed using a lead frame 130 that is cut to form lead frame pads 140 for attaching the imaging sensor 100, for example by surface mount technology (SMT). Optionally, the lead frame pads 140 are connected by bond wire connectors 150 to die pads 160 that are formed on the top surface of the die 110 like the antennas 120. In an exemplary embodiment of the disclosure, the die 110 is adhesively attached to the lead frame 130 with a silver epoxy glue 170. The silver epoxy glue 170 also serves as a mirror for reflecting the terahertz signal back to the antennas 120 to enhance reception. In some embodiments of the disclosure, other substrates can be used instead of a lead frame for mounting the imaging sensor, for example using a printed circuit board (PCB) or other technologies.

Figure 1B:
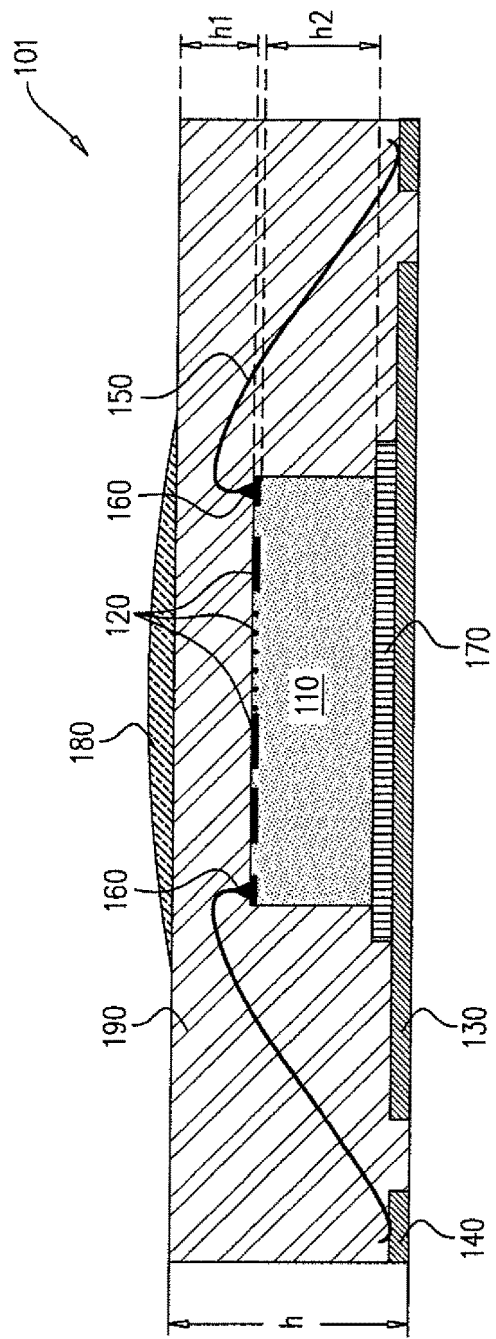

In an exemplary embodiment of the disclosure, the imaging sensor 100 is packaged using a curable material 190 that is molded to a desired shape, e.g. a box shaped package (a parallelepiped or rectangular parallelepiped). Optionally, the imaging sensor 100 can have a square or rectangular footprint. Alternatively, the footprint may be circular, oval or other shape. In some embodiments of the disclosure, the curable material 190 is transparent to terahertz signals, so that the packaging, which covers the antennas 120 does not interfere with reception of the signal by the antennas 120. Optionally, the curable material 190 can be for example an epoxy, a plastic or a polymer. In some embodiments of the disclosure, the antennas 120 are placed on an inner layer of the die instead of on the top surface of the die 110 to simplify the manufacturing process. Optionally, the dielectric material of the die 110 is also transparent to the terahertz signals. Alternatively, the curable material 190 and/or the material of the die 110 may affect the reception of the terahertz signal to the antennas 120, at least due to a change in the propagation medium. FIG. 1B is a schematic illustration of an alternative terahertz imaging sensor 101, according to an exemplary embodiment of the disclosure. Optionally, the packaging of the alternative terahertz imaging sensor 101 includes an additional extension 180, for example a lens shaped top (e.g. a dome) to focus the terahertz signal. In an exemplary embodiment of the disclosure, the extension is formed from the curable material 190 or from different materials.

Figure 2B:
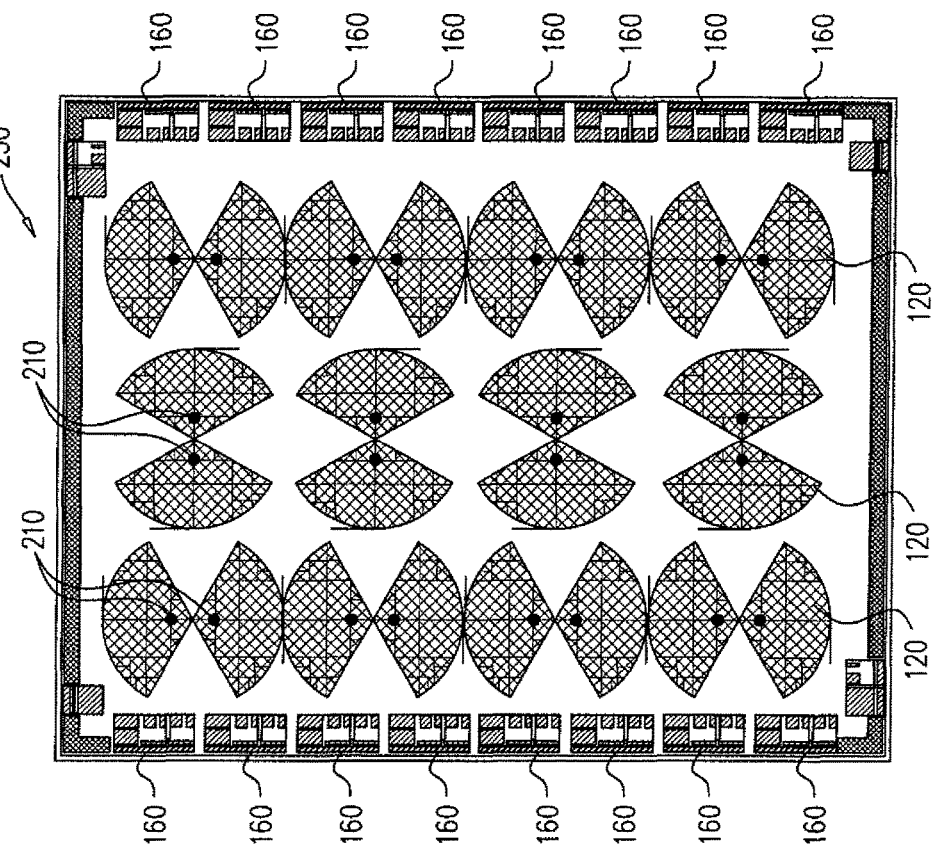
FIG. 2B is a schematic illustration of an alternative array of antennas on a terahertz imaging sensor, according to an exemplary embodiment of the disclosure.

FIG. 2A is a schematic illustration of an array of antennas 200 on a terahertz imaging sensor 100 and FIG. 2B is a schematic illustration of an alternative array of antennas 250 on a terahertz imaging sensor 100, according to an exemplary embodiment of the disclosure.

FIG. 2A shows an array of 4 by 4 antennas 120 for receiving a signal of specific polarization or a part of the signal with polarization matching the antennas. In contrast FIG. 2B shows an array of 3 by 4 antennas 120 with different orientation, for example to receive signals from different directions and/or signals having different polarization, for example horizontal, vertical, circular, right or left. In some embodiments of the disclosure, each antenna is designed for a different wavelength/frequency, for example by having a different size antenna. Optionally, this enables spectroscopic imaging, since each antenna receives a different part of the signal (e.g. different polarization, frequency).

Figure 3:
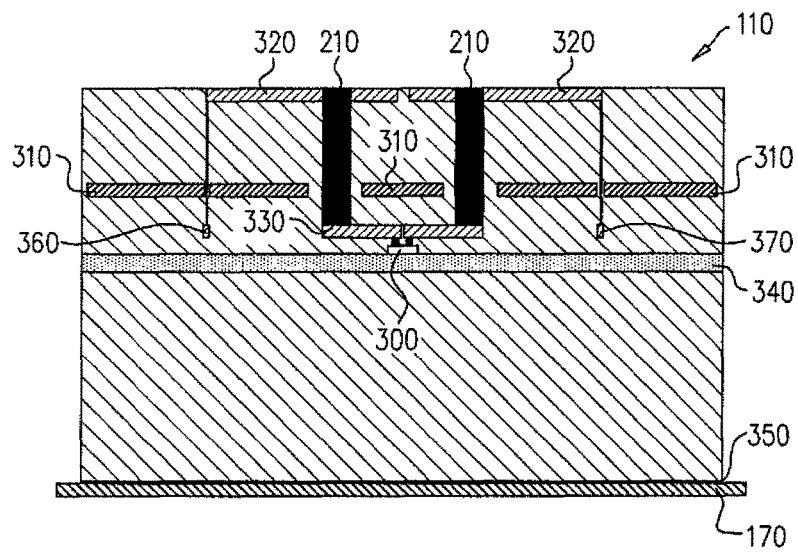
FIG. 3 is a schematic illustration of a side view of an imaging sensor die, according to an exemplary embodiment of the disclosure.
Figure 4:
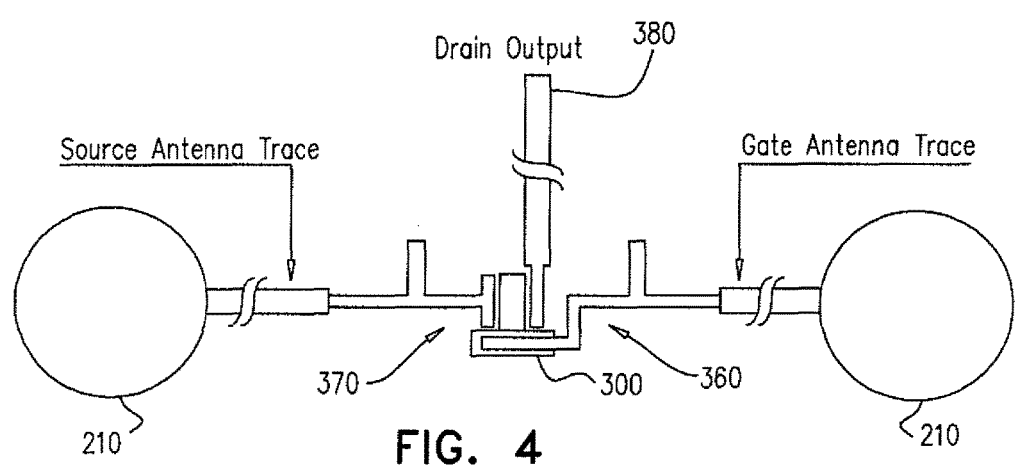
FIG. 4 is a schematic illustration of a top view of a CMOS detector in an imaging sensor die, according to an exemplary embodiment of the disclosure.

FIG. 3 is a schematic illustration of a side view of an imaging sensor die 110 and FIG. 4 is a schematic illustration of a top view of a CMOS detector 300 in an imaging sensor die 110, according to an exemplary embodiment of the disclosure. In an exemplary embodiment of the disclosure, each antenna 120 is coupled to a CMOS detector 300 (e.g. a FET transistor) that is positioned in the die 110 beneath the antenna 120. Optionally, the signals that are received by each antenna 120 are transferred to the CMOS detector 300 through via connectors 210. Optionally, the CMOS detector 300 includes a source 370, a gate 360 and a drain output 380 (FIG. 4). In an exemplary embodiment of the disclosure, the die includes one or more internal metal layers 330, which connect the antennas 120 and CMOS detector outputs to die pads 160 to enable outputting measurements from the CMOS detector 300.

The connections of each CMOS detector 300 are connected to die pads 160 to be wired to the lead pads 140 of imaging sensor 100, for example with bond wire connectors 150 or other technologies such as flip chip. Optionally, the CMOS detector 300 can be grounded or floating. Likewise the CMOS detector 300 can be differential or single ended.

In an exemplary embodiment of the disclosure, a metal shield layer 310 is placed above the CMOS detector 300 and below an antenna layer 320, which includes the antennas 120. Optionally, metal shield 310 prevents terahertz signals, infrared signals or other signals that pass the antennas 120 from interfering with the molecules of the CMOS detector 300 to improve the reception. In some embodiments of the disclosure, an oxide barrier layer 340 is formed below the CMOS detector 300, for example when using Silicon on isolator (SOI) technology. In some embodiments of the disclosure, a back metal coating 350 is formed on the bottom (back) of the die 110 to enhance the effect of the dielectric material in the die 110 and/or enhance the Antenna efficiency by using the back metal as a reflector and/or further protect the CMOS detector. In an exemplary embodiment of the disclosure, the die 110 is adhesively attached to the lead frame 130 with the silver epoxy glue 170.

Figure 5A:
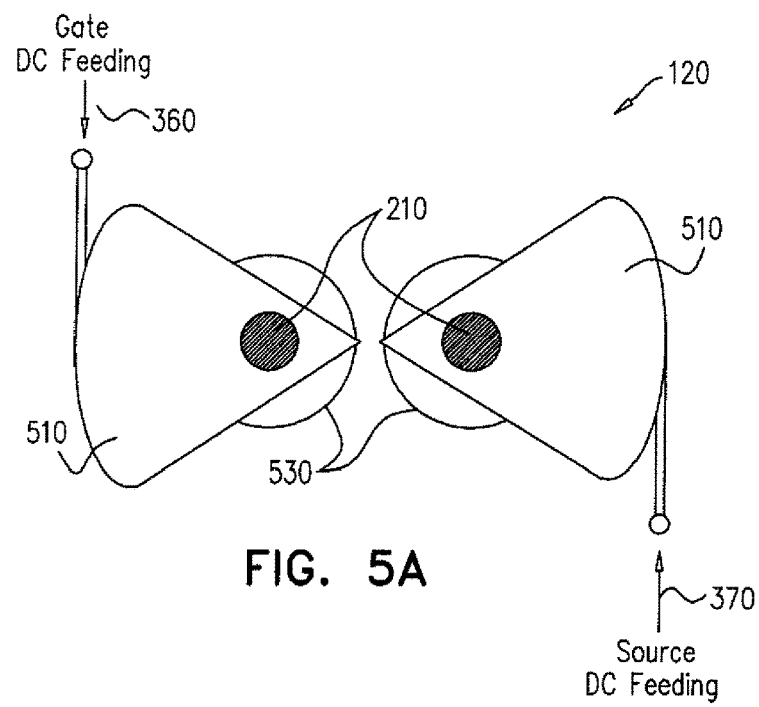
FIG. 5A is a schematic illustration of a top view of a single antenna of an imaging sensor, according to an exemplary embodiment of the disclosure.
Figure 5B:
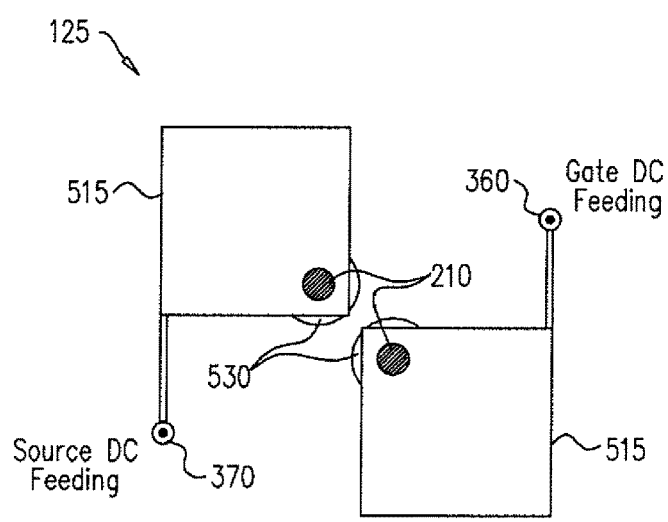
FIG. 5B is a schematic illustration of a top view of an alternative single antenna of an imaging sensor, according to an exemplary embodiment of the disclosure.

FIG. 5A is a schematic illustration of a top view of a single antenna 120 of an imaging sensor 100 and FIG. 5B is a schematic illustration of a top view of an alternative single antenna 125 of an imaging sensor 100, according to an exemplary embodiment of the disclosure.

In FIG. 5A the antenna 120 was printed on the die 110 in a bow tie shape 510 (e.g. two wings forming a bow tie), whereas in FIG. 5B the antenna 125 is a pair of square shaped areas 515 (each wing an independent square). Optionally, other shaped antennas may be used. In some embodiments of the disclosure, all the antennas on the die are of the same shape or alternatively, some are one shape and some are another. Likewise all the antennas on the die 110 may be in the same orientation or some may be in one orientation and some in another, for example as in FIG. 2B.

In an exemplary embodiment of the disclosure, each antenna 120, 125 is connected to the gate DC voltage 360 on one wing and connected to the source DC 370 on the other wing. Optionally, each of the two sides of the antenna are not electrically connected together directly, but rather only through via connectors 210 by CMOS detector 300. In an exemplary embodiment of the disclosure, each wing of the antenna has a via connector 210 that electronically connects the antenna to the CMOS detector 300. Optionally, a hole 530 with a larger diameter is formed through the dielectric material of the die 110 and the via connector 210 with a smaller diameter extends through the hole 530 leaving a clearance around it so that the via connector 210 only contacts the dielectric and does not have contact with other metal elements or metal layers in the die 110.

Figure 6:
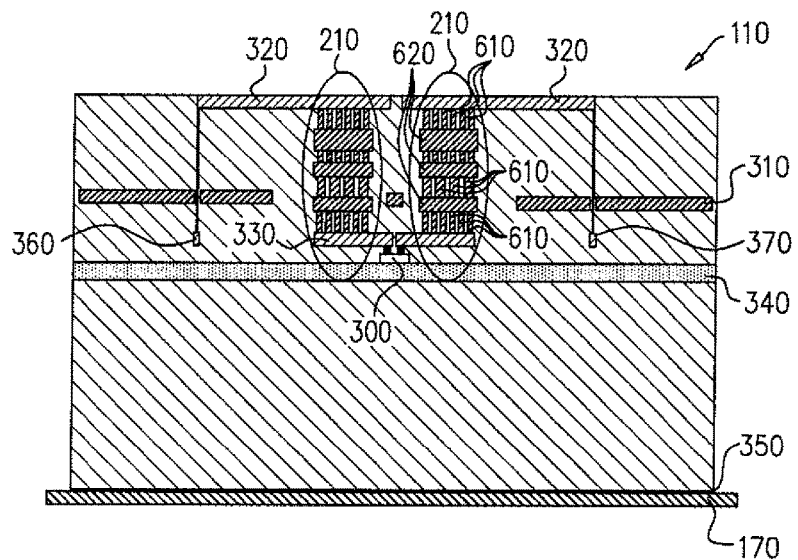
FIG. 6 is a schematic illustration of a side view of a via structure of an imaging sensor die, according to an exemplary embodiment of the disclosure.

FIG. 6 is a schematic illustration of a side view of a via structure 210 of an imaging sensor die 110, according to an exemplary embodiment of the disclosure. In an exemplary embodiment of the disclosure, the via connector 210 is not a solid electrical conductor (e.g. metal bar) that is inserted into the dielectric material of the die 110, but rather is made up of a stack of multiple layers having small conducting beams 610 connecting multiple metal layers 620, for example forming a tower structure. This enhances robustness of the via connector 210 and/or simplifies the manufacturing process. Optionally, the lowest metal layer 330 of the via structure 600 is in contact with CMOS detector 300.

Figure 7:
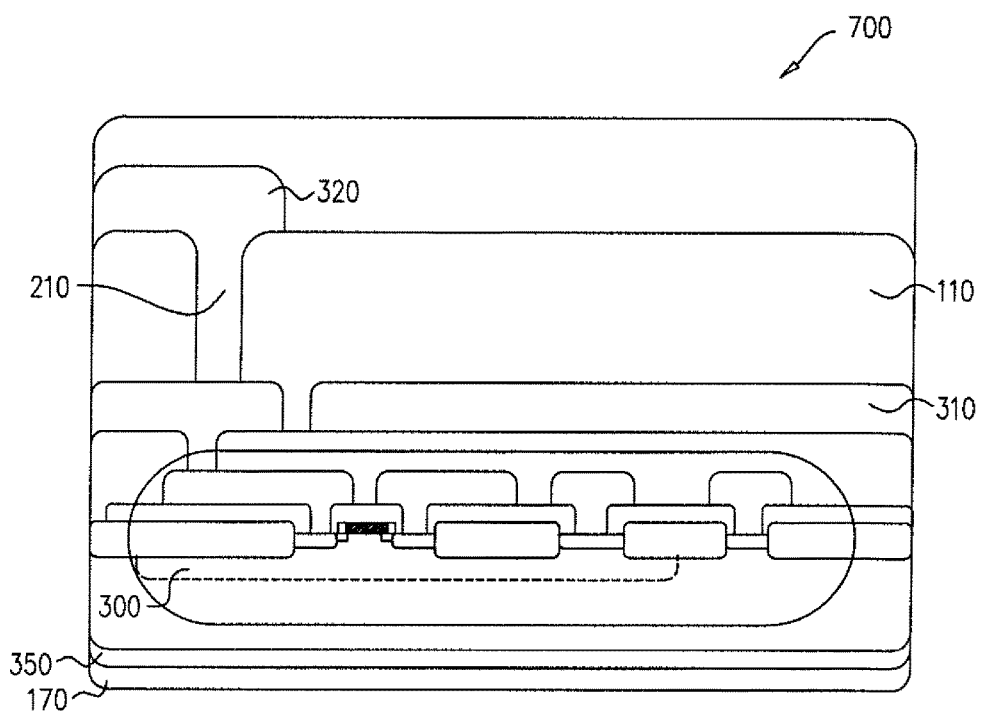
FIG. 7 is a schematic illustration of a cross sectional view of a manufacturing process of an imaging sensor die, according to an exemplary embodiment of the disclosure.

FIG. 7 is a schematic illustration of a cross sectional view of a manufacturing process of an imaging sensor die, according to an exemplary embodiment of the disclosure. Optionally, all the elements and layers of die 110 are prepared by a chip manufacturing process layer by layer.

Figure 8:
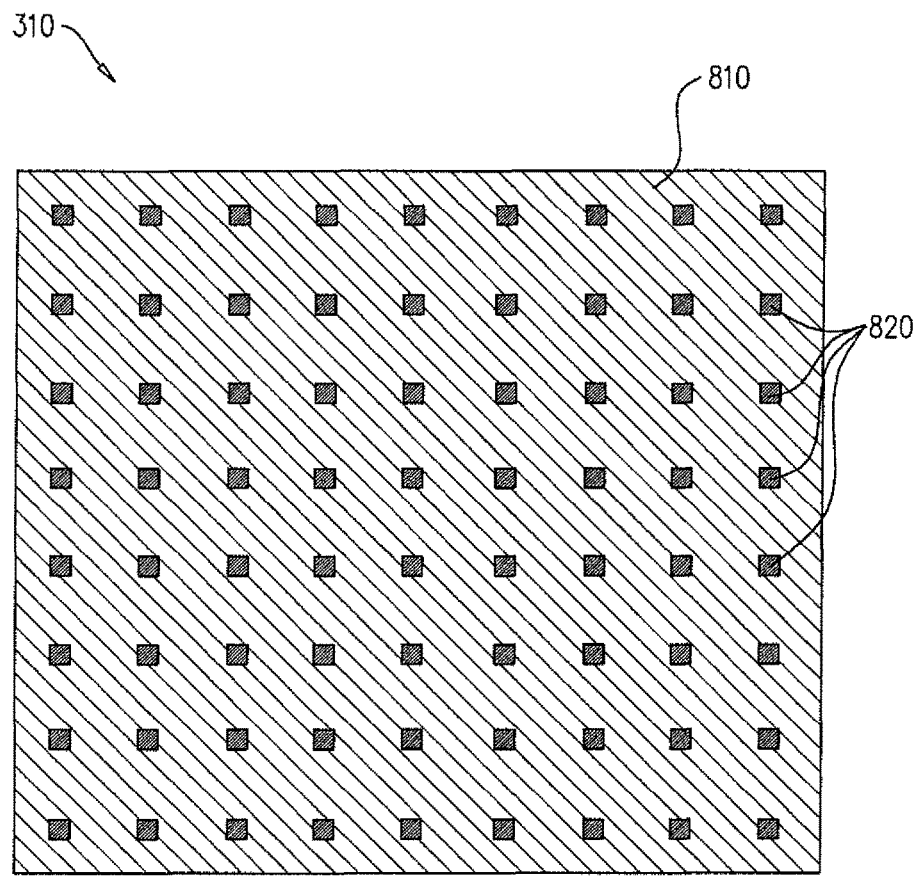
FIG. 8 is a schematic illustration of a top view of a shield layer in an imaging sensor die, according to an exemplary embodiment of the disclosure.

FIG. 8 is a schematic illustration of a top view of shield layer 310 in imaging sensor die 110, according to an exemplary embodiment of the disclosure. Optionally, the shield layer 310 is made up from a metal sheet 810, which can be a solid sheet or a printed layer. Metal sheet 810 may have an array of holes 820 (e.g. a porous sheet) wherein the holes 820 are filled with the dielectric material of the die 110. Optionally, the holes 820 are much smaller than the wavelength of the terahertz signal and/or other potentially interfering signals (e.g. infrared), so that the signals are blocked by the shield layer 310. Alternatively, metal sheet 810 can be a solid sheet without holes. In an exemplary embodiment of the disclosure, the shield layer 310 does not cover the position of the via conductor 210, for example by not reaching hole 530 or by being cut out at that area.

Figure 9A:
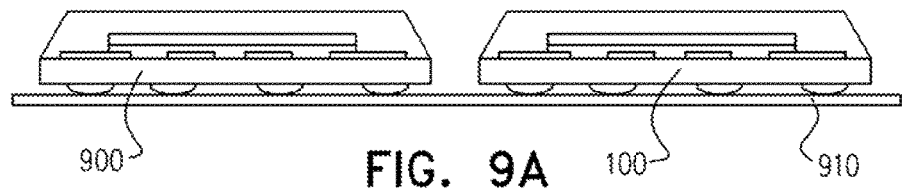
FIGS. 9A, 9B, 9C and 9D are schematic illustrations of embodiments of an integrated circuit combining an imaging sensor die and a low noise amplifier (LNA), according to an exemplary embodiment of the disclosure.

FIGS. 9A, 9B, 9C and 9D are schematic illustrations of embodiments of an integrated circuit combining imaging sensor 100 and a low noise amplifier (LNA) 900, according to an exemplary embodiment of the disclosure. In an exemplary embodiment of the disclosure, the CMOS detector 300 of imaging sensor 100 is connected to a low noise amplifier (LNA) 900 to enhance the measured terahertz signal for providing to external devices. In some embodiments of the disclosure, LNA 900 is placed next to imaging sensor 100, for example both mounted on a common substrate (e.g. a PCB—Printed Circuit Board) 910 as shown in FIG. 9A.

Figure 9B:
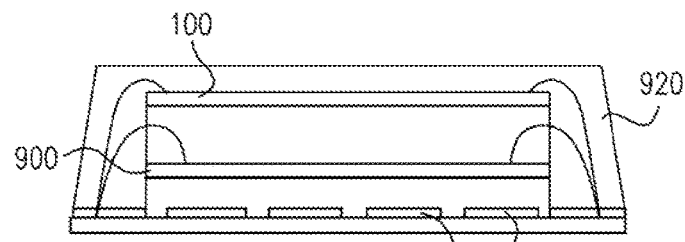
Figure 9C:
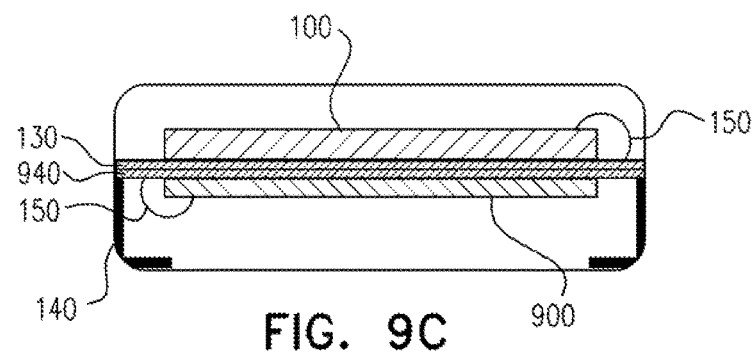

Alternatively, LNA 900 may be placed below imaging sensor 100 in a common chip enclosure 920, for example as shown in FIG. 9B e.g. with a common lead frame 930. Further alternatively, LNA 900 may be positioned bottom to bottom with imaging sensor 100 in a common chip enclosure, for example as shown in FIG. 9C with the lead frame 130 of the imaging sensor 100 facing the lead frame 940 of LNA 900.

Figure 9D:
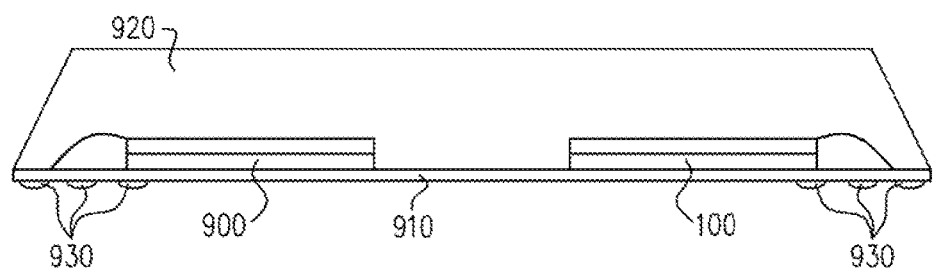

Further alternatively, as shown in FIG. 9D the LNA 900 is placed next to imaging sensor 100, for example both mounted on a common substrate and enclosed in a common chip enclosure 920 and optionally with a common lead frame 930.

In some embodiments of the disclosure, other Multi Chip Module (MCM) or Multi Chip Package (MCP) technologies may be used. Further alternatively, LNA 900 may be integrated into the same package as imaging sensor 100 (e.g. in the same silicon.

In an exemplary embodiment of the disclosure, LNA 900 may amplify each CMOS detector 300 independently or it may integrate all the CMOS detectors 300 of the array (e.g. 200 or 250) together. In some embodiments of the disclosure, the LNA 900 uses an internal chopping stabilizing technique to reduce the 1/f noise with an integrated low pass filter that removes the upper side of the demodulation. Optionally the LNA 900 has an internal gain control amplifier that has multiple gain levels (e.g. 4 or more). In an exemplary embodiment of the disclosure, an internal chopping stabilized signal can be fed by an internal oscillator or an external oscillator and/or a direct connection can be formed between inputs to output of the LNA 900 without using a chopping stabilizer.

In some embodiments of the disclosure, the LNA 900 includes an internal multiplexor for combining the signals from each CMOS detector 300 and providing a combined output. Optionally, the output is differential or single ended. In an exemplary embodiment of the disclosure, LNA 900 includes an internal DC removal loop that removes unwanted Amplifier DC products.

In some embodiments of the disclosure, the LNA 900 includes a temperature sensor. Optionally, the LNA 900 holds a high input impedance like Instrumental Amplifier that can go down to zero V common mode. Optionally, The LNA 900 includes an internal register that holds a control word of the LNA functionality, the internal register can read and write through a standard SPI bus or through another kind of bus. Optionally, the LNA input is DC coupled and can be AC coupled.

It should be appreciated that the above described methods and apparatus may be varied in many ways, including omitting or adding steps, changing the order of steps and the type of devices used. It should be appreciated that different features may be combined in different ways. In particular, not all the features shown above in a particular embodiment are necessary in every embodiment of the disclosure. Further combinations of the above features are also considered to be within the scope of some embodiments of the disclosure. It will also be appreciated by persons skilled in the art that the present disclosure is not limited to what has been particularly shown and described hereinabove.

We claim:

1. An imaging sensor for accepting terahertz signals, comprising:
   a die made of a dielectric material;
   one or more antennas for receiving terahertz signals, positioned on top of the die or in an upper layer of the die;
   each antenna having a CMOS detector electrically coupled to the antenna and positioned in the die below the antenna;
   a metal shield layer in the die below the antennas and above the CMOS detectors, shielding the CMOS detector from interference signals; said metal shield layer is a porous layer filled with the dielectric material of the die;
   a shielding layer under the die comprising a metal coating and/or a layer of silver epoxy glue for attaching the bottom of the die to a lead frame.

2. An imaging sensor according to claim 1, wherein multiple antennas are positioned to form an array.

3. An imaging sensor according to claim 1, wherein all of the antennas are identical.

4. An imaging sensor according to claim 1, wherein some of the antennas have different orientations.

5. An imaging sensor according to claim 1, wherein some of the antennas are distinct.

6. An imaging sensor according to claim 1, wherein each antenna comprises two wings, one connected to the CMOS detector gate and one connected to the CMOS detector source.

7. An imaging sensor according to claim 1, wherein each antenna is electrically coupled to the CMOS detector by a pair of via connectors.

8. An imaging sensor according to claim 7, wherein the via connectors are located in a hole in the die with a clearance between the via connector and the metal layers in the die.

9. An imaging sensor according to claim 7, wherein the via connectors comprise a stack of metal layers supported by conducting beams between the metal layers.

10. An imaging sensor according to claim 1, wherein the imaging sensor includes a low noise amplifier in the same integrated circuit package as the die.

11. An imaging sensor according to claim 10, wherein the low noise amplifier is positioned under the die.

12. An imaging sensor according to claim 11, wherein the low noise amplifier is positioned upside down under the die.

13. An imaging sensor according to claim 1, wherein the imaging sensor is packaged with a lens shaped top to focus the terahertz signals received by the antennas.

14. An integrated circuit according to claim 1, comprising:
    a low noise amplifier (LNA); wherein said LNA uses an internal chopping stabilizing technique to reduce 1/f noise with an integrated low pass filter that removes an upper side of the demodulation.

15. A method of forming an imaging sensor for accepting terahertz signals, comprising:
    positioning one or more antennas for receiving terahertz signals on top of a dielectric die made of a dielectric material or in an upper layer of the die;
    electrically coupling a CMOS detector to each antenna; wherein the CMOS detector is positioned in the die below the antenna;
    forming a metal shield layer in the die below the antennas and above the CMOS detectors, for shielding the CMOS detector from interference signals; said metal shield layer is a porous layer filled with the dielectric material of the die;
    coating the bottom of the die with a metal coating and/or using a layer of silver epoxy glue for attaching the bottom of the die to a lead frame.

16. A method according to claim 15, wherein multiple antennas are positioned to form an array.

17. A method according to claim 15, wherein all of the antennas are identical.

18. A method according to claim 15, wherein some of the antennas have different orientations.

19. A method according to claim 15, wherein some of the antennas are distinct.

20. A method according to claim 15, wherein each antenna comprises two wings, one connected to the CMOS detector gate and one connected to the CMOS detector source.

* * * * *